(12) United States Patent
Vonstaudt

(10) Patent No.: US 7,395,169 B2
(45) Date of Patent: Jul. 1, 2008

(54) MEMORY TEST ENGINE

(75) Inventor: Hans Martin Vonstaudt, Kirchheim/Teck-Nabern (DE)

(73) Assignee: Dialog Semiconductor, Kirchheim/Teck-Nabern (DE)

( * ) Notice: Subject to any disclaimer, the term of this patent is extended or adjusted under 35 U.S.C. 154(b) by 0 days.

(21) Appl. No.: 11/446,625

(22) Filed: Jun. 5, 2006

(65) Prior Publication Data

US 2007/0271059 A1   Nov. 22, 2007

(30) Foreign Application Priority Data

May 18, 2006   (EP) .................................. 06392009

(51) Int. Cl.
*G01R 31/00* (2006.01)

(52) U.S. Cl. ...................... 702/117; 714/718; 714/724
(58) Field of Classification Search ....................... None
See application file for complete search history.

(56) References Cited

U.S. PATENT DOCUMENTS

| 4,481,627 | A | * | 11/1984 | Beauchesne et al. | ........ 714/718 |
| 4,873,705 | A | | 10/1989 | Johnson | |
| 6,072,737 | A | | 6/2000 | Morgan et al. | |
| 6,182,257 | B1 | | 1/2001 | Gillingham | |
| 6,286,115 | B1 | | 9/2001 | Stubbs | |
| 6,331,770 | B1 | | 12/2001 | Sugamori | |
| 6,449,741 | B1 | * | 9/2002 | Organ et al. | ................ 714/724 |
| 6,587,979 | B1 | | 7/2003 | Kraus et al. | |
| 6,653,855 | B2 | | 11/2003 | Mori et al. | |
| 6,721,904 | B2 | | 4/2004 | Ernst et al. | |
| 6,829,728 | B2 | | 12/2004 | Cheng et al. | |
| 2003/0074153 | A1 | | 4/2003 | Sugamori et al. | |
| 2003/0169222 | A1 | * | 9/2003 | Burkhardt | ..................... 345/87 |
| 2005/0058077 | A1 | | 3/2005 | Mayr | |
| 2006/0273809 | A1 | * | 12/2006 | Miller et al. | ................. 324/754 |

OTHER PUBLICATIONS

"On Test and Diagnostics of Flash Memories", by Chih-Tsun Huang et al., Proc. of the 13th Asian Test Symposium (ATS 2004), 2004 IEEE.
Nikila K. et al., "DFT for Test Optimisations in a Complex Mixed-Signal Soc-Case Study on TI's TNGTD7300 ADSL Modem Device", ITC Int'l Test Conf., IEEE 2004, Charlotte, NC Oct. 26-28, 2004, pp. 773-782, XP010763683, ISSN: 0-7803-8580-2.

* cited by examiner

*Primary Examiner*—John E. Barlow, Jr.
*Assistant Examiner*—Jonathan Moffat
(74) *Attorney, Agent, or Firm*—Saile Ackerman LLC; Stephen B. Ackerman

(57) ABSTRACT

A memory test engine performs memory tests on an embedded memory located in a device under test (DUT) simultaneous to analog tests performed by an automatic tester. The automatic tester provides coded information to the memory test engine, which includes a description of the embedded memory within the DUT. The memory test engine operates autonomous to the automatic tester; apply addresses, data and control and comparing results of the memory test to expected values. The automatic tester and the memory test engine use the same DUT data bus; and therefore, arbitrate the use of the bus of the DUT.

25 Claims, 4 Drawing Sheets

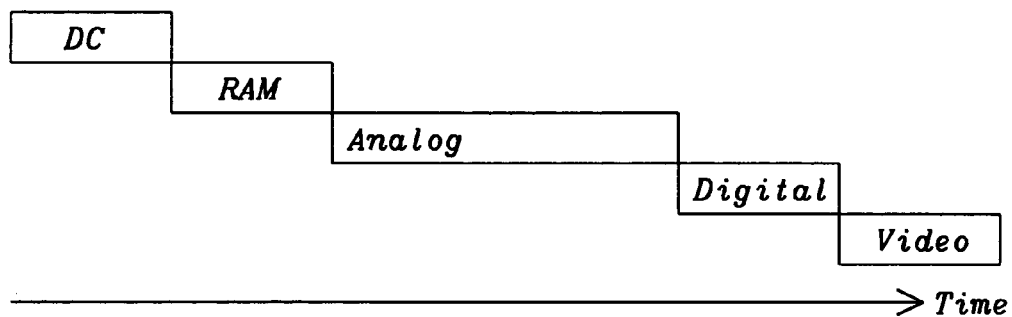
FIG. 1 - Prior Art
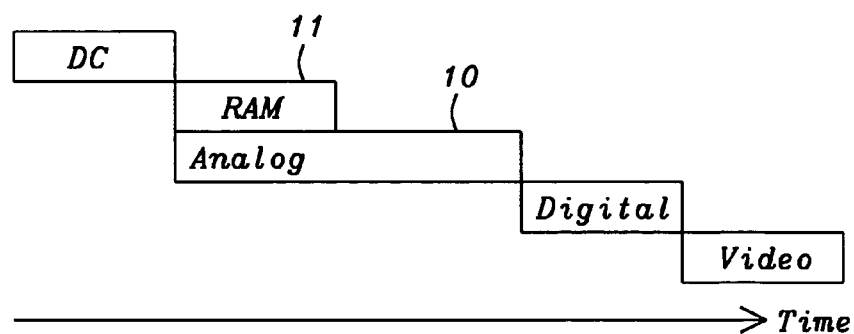
FIG. 2

MEMORY TEST ENGINE

BACKGROUND OF THE INVENTION

1. Field of Invention

A semiconductor tester and in particular a built-off self test (BOST) for an embedded memory in a device operating simultaneous to other testing being performed.

2. Description of Related Art

Built in self test (BIST) capability occupies valuable real estate on a semiconductor chip especially for implementing a memory BIST. Economics is a prime consideration for semiconductor LCD (liquid crystal display) driver devices. Not only is the real estate that would be occupied with a BIST circuit costly, but also the need to have a tester to perform a set of tests on a semiconductor chip with a diverse set of circuitry is also costly. Testing of such a device requires a sequential set of test procedures in which the testing of the embedded memory occupies a substantial portion of the total test time. Finding ways to reduce the total test time of a device with such a diverse set of requirements is important to the reduction of total product cost.

U.S. Pat. No. 6,829,728 (Cheng et al.) is directed to a test circuit for testing embedded synchronous memories where a BIST (built-in self test) controller is used to address the memory and provide reference data to compare to the memory output. U.S. Pat. No. 6,721,904 (Ernst et al.) is directed to a BOST (built off (chip) self test) function located between a DUT (device under test) and a semiconductor tester for the purpose of testing a SDRAM. U.S. Pat. No. 6,653,855 (Mori et al.) is directed to a BOST board containing a connector, a substrate and an external self test circuit. In U.S. Pat. No. 6,587,979 (Kraus et al.) a flexible BIST is directed to being incorporated into an integrated circuit chip. In U.S. Pat. No. 6,286,115 (Stubbs) discloses a test circuit is directed an on-chip test circuit that includes a multiplexer and an interface to I/O to allow interfacing with I/O associated an embedded memory to allow testing and repairing the embedded memory. U.S. Pat. No. 6,182,257 (Gillingham) is directed to a semiconductor device with a self test circuit, which includes a test memory array, a self test controller for internally generating test and results data, and an interface for loading test data into the test memory array. U.S. Pat. No. 6,072,737 (Morgan et al.) is directed to an embedded test circuit to test an embedded DRAM of an integrated circuit chip wherein the test circuitry interfaces with a memory tester. In U.S. Pat. No. 4,873,705 (Johnson) a method and system is directed to functionally testing memories in microprocessor based units or boards under test with an interface circuit coupled to the bus structure of the unit under test.

In FIG. 1 is a diagram of prior art showing a test time sequence for testing an LCD driver chip as might be performed by automatic test equipment (ATE). DC tests are first performed as an initial screen of the chip to determine the ability of the chip to be powered and have I/O circuits free of shorts and opens. A test is then performed on the embedded array (RAM) to determine the capability of the array to properly store and read data This is then followed by analog tests to test the ability of the I/O drivers and receivers to function properly, followed by a test of the digital circuits and the chips video capability.

A built-in-self-test (BIST) circuit could be useful in reducing the test time required by an ATE particularly with respect to the embedded memory, but this would be at the cost of the additional chip size required to accommodate the BIST circuitry and the BIST would require testing. A built-off-(chip)-self test (BOST) could also be used, but an allocation of test time is still required for the embedded memory.

SUMMARY OF THE INVENTION

It is an objective of the present invention to provide an embedded memory test of an LCD driver chip that overlaps analog testing of the chip.

It is also an objective of the present invention to provide the RAM test of the LCD driver chip that is performed by a MTE (memory test engine) circuit, which is physically mounted on the probe head for the LCD chips.

It is still an objective of the present invention to probe a plurality of chips to perform chip test on the plurality of chips simultaneously.

It is further an objective of the present invention to arbitrate the use of the data bus connected to the device under test between the embedded memory test and the analog test to prevent interference between overlapped tests.

It is still further an objective of the present invention to download test algorithms and array mapping from automatic test equipment (ATE) to the MTE circuitry comprising a microcontroller and a field programmable gate array (FPGA).

It is also further an objective of the present invention to translate microinstructions from the microcontroller to the FPGA for execution in the embedded array of the LCD driver chip.

In the present invention an MTE (memory test engine) circuit is mounted above the probe head that is used to contact a plurality of semiconductor chips simultaneously. The MTE circuit receives test instructions from an ATE (automatic test equipment) and converts these instructions into addresses, data and control information to test embedded arrays within the chips contacted by the test probe head. The specific chips under test are LCD driver chips; although, the methodology herein of the present invention is applicable to other chips serving other purposes.

The LCD driver chips are tested for DC parameters, analog capability of the drivers, logic circuitry surrounding the functions contained on the chip, video capability as well as the capability of the embedded array. The analog testing consumes a substantial amount of time and is separate from the embedded array, which has a different addressing requirement than the driver circuits. This allows the testing of the embedded array to be overlapped in time with the analog testing of the driver circuits and allows the shortening of the total test time for the driver chips.

An arbiter function within the FPGA in the MTE circuit coordinates the use of the data bus with the ATE to test the LCD chips between the analog testing and the memory testing. Other than the coordination and receiving test instruction from the ATE, the MTE circuit operates independent of the ATE as is done with BIST circuitry embedded within semiconductor chips without occupying valuable semiconductor real estate required by a BIST circuit.

BRIEF DESCRIPTION OF THE DRAWINGS

This invention will be described with reference to the accompanying drawings, wherein:

FIG. 1 is diagram showing a test sequence time line of prior art;

FIG. 2 is a diagram showing the test sequence time line of the present invention;

DETAILED DESCRIPTION OF THE PREFERRED EMBODIMENT

In FIG. 2 is a test time sequence of the present invention for testing an LCD driver chip performed by automatic test equipment (ATE) and a memory test engine (MTE). The MTE is a form of a BOST (built off-chip self test) circuit where the MTE performs memory tests independent of the ATE. DC screening tests are performed first by the ATE in a sequence of tests followed by analog tests 10 performed by the ATE overlapped by embedded memory (RAM) 11 performed by the MTE circuitry. Digital testing of the logic on the LCD driver chip and the video testing, both performed by the ATE, follow the overlap testing 10 and 11. The test sequence of the present invention shortens the total test time by the amount of time required to perform the embedded memory tests.

Figure 3:
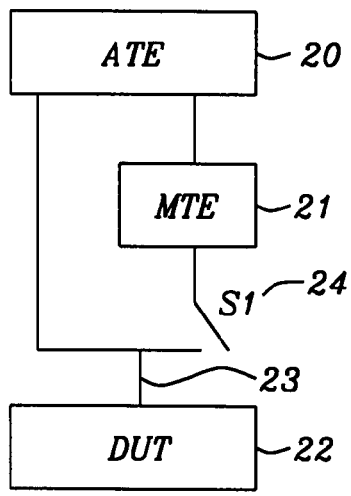
FIG. 3 is a block diagram of the present invention for the basic test circuitry configuration.

In FIG. 3 is shown the basic test circuit of the present invention where the ATE 20 and the MTE 21 are connected to a DUT 22 using a bus 23 of the DUT. A switch S1 24 connects the MTE to the bus 23 The MTE when connected to the bus allows the MTE to perform memory tests on the embedded memory of the DUT in parallel with analog tests performed on the DUT 22 by the ATE 20.

Figure 4:
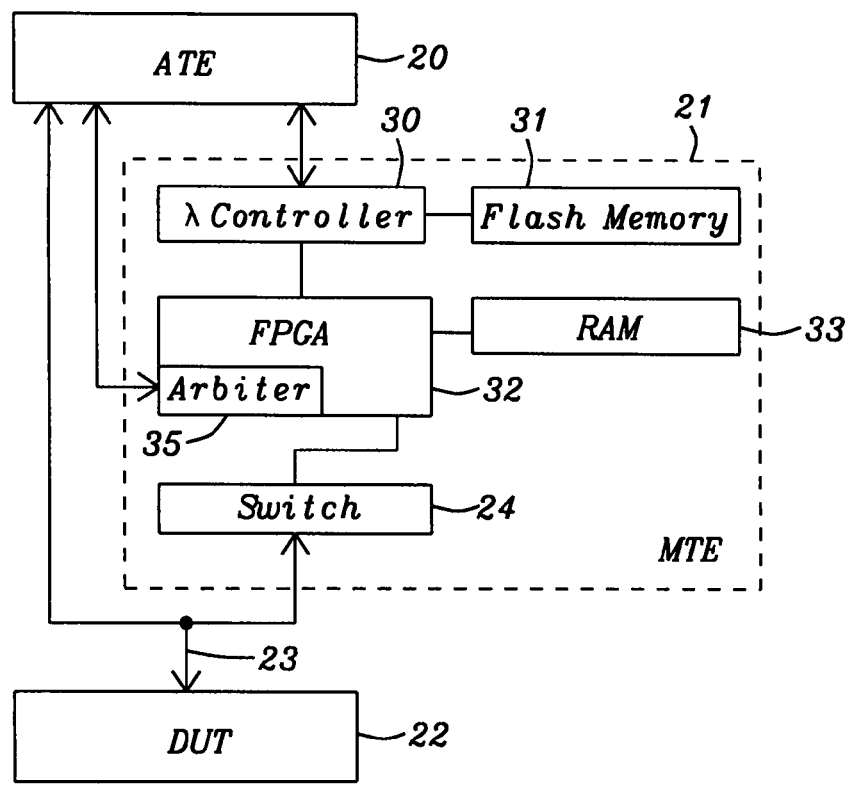
FIG. 4 is a block diagram of the present invention demonstrating the functions of the MTE circuitry and the interconnectivity to the ATE and a DUT (device under test)

In FIG. 4 is block diagram of the MTE 21 and connectivity between the MTE and the ATE 20 and the DUT 22. The ATE 20 communicates coded information to microcontroller 30 of the MTE 21, which comprises the embedded memory size within the DUT, physical configuration of the embedded memory and the chosen test algorithm. A flash memory 31 connected to the microcontroller contains the software for the microcontroller 30. The flash memory 31 is programmed with a boundary scan port. The microcontroller couples microinstructions to the FPGA (field programmable gate array) 32. The RAM 33 that is connected to the FPGA is used to contain a map of the embedded memory of the DUT. The RAM 33 is preferably implemented using an SRAM, but other random access memories can be used. An arbiter function 35 within the FPGA communicates with the ATE 20 to arbitrate the use of the bus 23 of the DUT 22 and a switch 24 is used to couple the MTE 21 to the bus of the DUT when embedded memory testing is being performed simultaneous to analog testing from the ATE.

Figure 5:
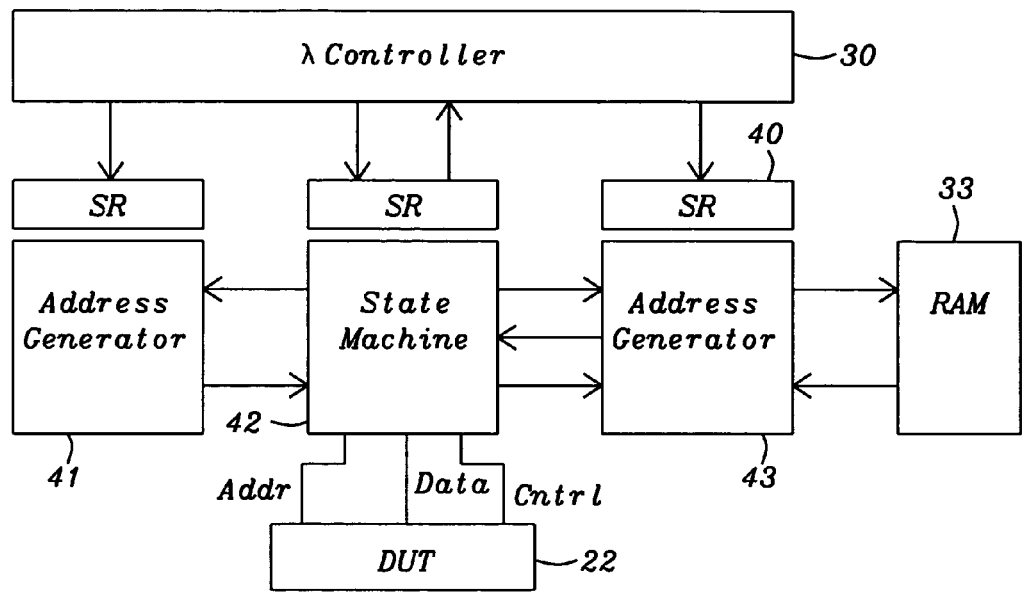
FIG. 5 is a block diagram of the present invention of the logical functions of the MTE.

FIG. 5 is a block diagram of the present invention of the logical functions of the MTE. The microcontroller 30 generates codes for the state machine 42 and transfers these codes to status registers (SR) 40. The address generator 40 generates the next address for testing the embedded memory of the DUT 22 in accordance with the mapping of the embedded memory that is defined in the SR 40. In accordance with the embedded memory in the DUT 22, the state machine 42 selects an address from the address generator 41 or an increment/decrement address. The next address created by the address generator 40 corresponds to the memory mapping provided by the microcontroller 30 and defined in the status registers 40.

The data generator 43 calculates the correct data word to be applied to the embedded memory of the DUT 22 according to the algorithm supplied by the microcontroller 30 through the status registers 42, and evaluates the test results by comparing the test results to expected values that are dynamically generated. Mismatches between actual measurements and expected values are initially stored in an error buffer and then transferred to the RAM 33 to generate a bit map and image of the tested embedded memory of the DUT 22. This allows the results of the embedded memory test of the DUT 22 to be analyzed later by image processing algorithms to determine failure mechanisms. When a "march test" is performed, the embedded memory bits are first set and then on a separate pass through the embedded memory the memory cells are read and the values read are compared to data calculated by the data generator 43.

When a test error occurs, the memory cell location and the value of the error are stored in an error buffer within the FPGA 21. All data read from the embedded memory is stored in a memory map buffer located in the RAM 33. A test status flag is set in a status register 40 of the state machine 42. The microcontroller 30 couples the test status flag to the ATE 20 to indicate the results of the test of embedded memory within the DUT 22. Besides coupling the test results to the ATE, the microcontroller 30 is capable of coupling to the ATE 20 defective memory cells to provide information for possible repair actions.

Figure 6:
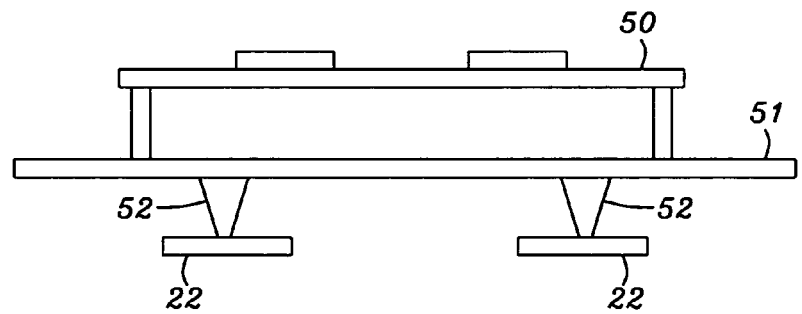
FIG. 6 is a conceptual diagram of the physical location of the MTE circuitry above a chip probe head of the present invention.

In FIG. 6 is a conceptual diagram of the location of the memory test engine (MTE). The MTE circuit board 50 is located above the test probe board 51. Located under the test probe board 51 are a plurality of test probes 52 that contact a plurality of LCD driver chips 22 simultaneously. The test from the ATE 20 and the MTE 21 are applied to the plurality the chips 22 contacted with the plurality of probes 22, simultaneously. This requires the RAM 33 connected to the data generator 43 to be large enough to contain memory maps of the plurality of chips 22 being simultaneously tested.

Figure 7:
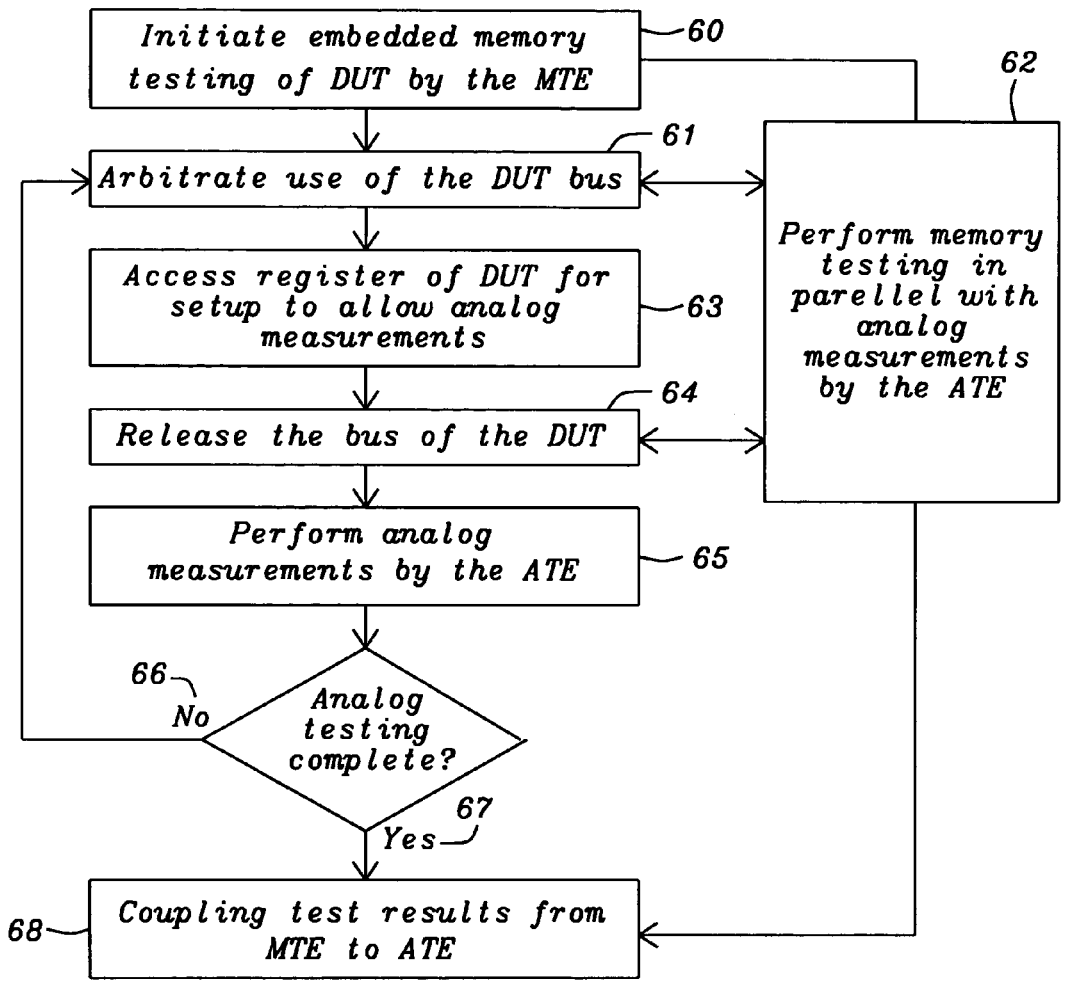
FIG. 7 is a flow diagram of the present invention for performing memory testing and analog testing simultaneous.

FIG. 7 is a flow diagram of the method of the present invention for performing both embedded memory testing and analog testing in parallel on an LCD driver chip (DUT). After a DUT has been tested for catastrophic failures and has been found not to have a catastrophic failure, a test of an embedded memory within the DUT is initiated 60 using the memory test engine (MTE) located in the probe head. The test of the embedded memory requires that the MTE circuit access the LCD driver chip through the DUT data bus to set up and run the memory tests. Since there is only one data bus emanating from the DUT for use by data and set up, the use of the data bus is arbitrated 61 between the requirements of the memory testing controlled by the MTE circuit and the requirements of analog measurements performed by automatic test equipment (ATE). The arbitration of the data bus is a negotiation between the ate and a FPGA (field programmable gate array) located in MTE circuit. The memory testing 62 of the embedded memory within the DUT comprises addressing, controlling and providing data to the embedded memory from the MTE, and the embedded memory testing is performed in parallel with the analog testing of the DUT. When either the memory testing or the analog testing requires usage of the data bus of the DUT, each usage of the data bus is arbitrated 61 between the test functions requiring use of the data bus to resolve conflicts in the usage.

Continuing to refer to FIG. 7, upon arbitration of the data bus 61, the register of the DUT is accessed to perform a setup of the DUT to allow analog measurements 63. Once the setup is complete, the data bus of the DUT is released 64 to allow usage by subsequent test requirements, either by the analog or the embedded memory testing. The analog measurements of the DUT are performed by the ATE 65 while embedded memory tests controlled by the MTE are being performed in parallel. If the analog measurements are not complete 66, the ATE arbitrates with the MTE for the usage of the DUT data bus 61 and repeats the access of the DUT registers through the data bus 63 after which the ATE releases the DUT data bus 64, and analog measurements 65 are performed by the ATE on the DUT. If the analog testing is complete 67, results of the embedded memory tests, which are accumulated in the MTE, are returned from the MTE to the ATE 68.

While the invention has been particularly shown and described with reference to preferred embodiments thereof, it will be understood by those skilled in the art that various changes in form and details may be made without departing from the spirit and scope of the invention.

What is claimed is:

1. A test circuit, comprising:
   a) an ATE (automatic test equipment);
   b) a MTE (memory test engine) circuit;
   c) a device test probe;
   d) said MTE circuit mounted above said device test probe and coupled to a DUT (device under test) through said device test probe; and
   e) said ATE coupled to said DUT through said test probe to perform tests on said DUT and coupled to said MTE circuit to provide test instructions whereby said MTE circuit carries out a sequence of tests on said DUT in parallel with test from said ATE, wherein use of a test bus coupled to said DUT is arbitrated by an arbiter function to control parallel testing between said MTE and said ATE.

2. A test circuit, comprising:
   a) an ATE (automatic test equipment);
   b) a MTE (memory test engine) circuit;
   c) a device test probe;
   d) said MTE circuit mounted above said device test probe and coupled to a DUT (device under test) through said device test probe; and
   e) said ATE coupled to said DUT through said test probe to perform tests on said DUT and coupled to said MTE circuit to provide test instructions whereby said MTE circuit carries out a sequence of tests on said DUT in parallel with test from said ATE, wherein a test bus coupled to said DUT is coordinated to control parallel testing between said MTE and said ATE;
   f) said MTE circuit coordinates use of the test bus to perform parallel testing of said DUT with the ATE.

3. A test circuit, comprising:
   a) an ATE (automatic test equipment);
   b) a MTE (memory test engine) circuit;
   c) a device test probe;
   d) said MTE circuit mounted above said device test probe and coupled to a DUT (device under test) through said device test probe;
   e) said ATE coupled to said DUT through said test probe to perform tests on said DUT and coupled to said MTE circuit to provide test instructions whereby said MTE circuit carries out a sequence of tests on said DUT in parallel with test from said ATE;
   f) said MTE circuit coordinates parallel testing of said DUT with the ATE; and
   g) said coordination of the parallel testing is a coordinated use of a test bus connected to said DUT.

4. The test circuit of claim 3, wherein said MTE circuit performs tests on an embedded array of said DUT in parallel to analog tests performed by said ATE.

5. The test circuit of claim 3, wherein said device test probe contacts a plurality of DUT's simultaneously to test said plurality of DUT's in parallel.

6. A test circuit, comprising:
   a) an ATE (automatic test equipment);
   b) a MTE (memory test engine) circuit;
   c) a device test probe;
   d) said MTE circuit mounted above said chip test probe and coupled to a DUT (device under test) through said device test probe;
   e) said ATE coupled to said DUT through said test probe to perform tests on said DUT and coupled to said MTE circuit to provide test instructions whereby said MTE circuit carries out a sequence of tests on said DUT in parallel with test from said ATE; and
   f) said MTE circuit further comprises a microcontroller, a FPGA (field programmable gate array), a flash memory, a random access memory and a switch.

7. The test circuit of claim 6, wherein said microcontroller interfaces with said ATE and to receive code information about said DUT and transfers microinstructions to said FPGA.

8. The test circuit of claim 6, wherein said FPGA provides addresses, data and control to the DUT and provides a coordinated use of a test bus connected to said DUT and used by both the ATE and the MTE circuit.

9. The test circuit of claim 6, wherein said switch disconnects said MTE circuit from the device test probe.

10. A test circuit, comprising:
    a) an ATE (automatic test equipment);
    b) a MTE (memory test engine) circuit;
    c) a device test probe;
    d) said MTE circuit mounted above said device test probe and coupled to a DUT (device under test) through said device test probe;
    e) said ATE coupled to said DUT through said test probe to perform tests on said DUT and coupled to said MTE circuit to provide test instructions whereby said MTE circuit carries out a sequence of tests on said DUT in parallel with test from said ATE, wherein use of a test bus coupled to said DUT is arbitrated by an arbiter function to control parallel testing between the MTE and The ATE; and
    f) said DUT is an LCD (liquid crystal display) driver chip containing an embedded memory.

11. An external test circuit, comprising:
    a) a means to couple an ATE (automatic test equipment) and a MTE (memory test engine) circuit to a same DUT (device under test);
    c) a means to instruct said MTE circuit and allow said MTE circuit to perform tests independent of the ATE;
    d) a means to arbitrate the use of a data bus of said DUT between said ATE and said MTE circuit; and
    e) a means to overlap a test from said ATE with a test from a BOST (built off-chip self test) circuit formed within the MTE.

12. An external test circuit, comprising:
    a) a means to couple an ATE (automatic test equipment) and a MTE (memory test engine) circuit to a same DUT (device under test);
    c) a means to instruct said MTE circuit and allow said MTE circuit to perform tests independent of the ATE;
    d) a means to share the use of a data bus of said DUT between said ATE and said MTE circuit; and
    e) a means to overlap a test from said ATE with a test from a BOST (built off-chip self test) circuit formed within the MTE;

f) said means to couple the ATE and the BOST circuit to the same DUT uses said data bus of the DUT, wherein the BOST circuit is disconnected from the data bus when the BOST circuit is not being used.

13. The test circuit of claim 12, wherein said means to instruct said MTE circuit is provided to the MTE circuit from the ATE and further comprises:
   a) a size of an embedded memory within said DUT;
   b) a physical memory configuration of said embedded memory;
   c) a pin configuration of said DUT;
   d) a test algorithm; and
   e) a microcontroller within said MTE circuit receives the instructions from the ATE and connects microinstructions to a FPGA (field programmable gate array) within the MTE circuit that are executed by the FPGA to perform tests of said embedded memory in the DUT, receive back test results from said embedded memory and compare said test results to an expected value.

14. The test circuit of claim 12, wherein said means to share the use of a data bus of said DUT between said ATE and said MTE circuit comprises arbitration of the use of said data bus.

15. The test circuit of claim 12, wherein said means to overlap a test from said ATE with a test from said MTE circuit overlaps an analog test performed by said ATE with a memory test performed by said MTE circuit.

16. The test circuit of claim 15, wherein analog tests and said memory tests use separate DUT addressing.

17. The test circuit of claim 15 wherein said MTE circuit provides addresses, data and control of the embedded memory of the DUT and receives back from said DUT test results that are compared in the MTE circuit to expected test results.

18. The test circuit of claim 12, wherein said DUT is an LCD driver chip that contains an embedded memory.

19. A method for performing tests in parallel, comprising:
   a) initiating an embedded memory test of a DUT (device under test) using an MTE (memory test engine) mounted on a test probe head for contacting said DUT;
   b) performing said embedded memory test controlled by said MTE using a data bus of said DUT;
   c) arbitrating usage of said data bus when initiating analog measurements of said DUT in parallel with said embedded memory tests to prevent conflicts between test functions;
   d) accessing a register of said DUT to setup analog measurements;
   e) releasing said usage of the data bus;
   f) performing analog measurements on the DUT with an ATE (automatic test equipment);
   g) arbitrating usage of the data bus and repeating steps c) through f) until analog testing is complete; and
   h) coupling memory test results from said MTE circuit to said ATE upon completion of testing.

20. The method of claim 19, wherein initiating tests of the embedded memory couples the MTE circuit to said DUT through data bus.

21. The method of claim 19, wherein arbitrating usage of the data bus resolves conflicts between setup of said analog measurements and said embedded memory test.

22. The method of claim 19, wherein said arbitrating usage of the data bus of the DUT is conducted between the ATE and a FPGA (field programmable gate array) within said MTE circuit.

23. The method of claim 19, wherein performing said embedded memory test further comprises using said data bus for addressing the embedded memory, providing data to the embedded memory, and controlling the embedded memory.

24. The method of claim 19, wherein returning embedded memory test results to said MTE circuit allows comparison of the test results to expected values.

25. The method of claim 19, wherein the DUT is an LCD driver device.

* * * * *

UNITED STATES PATENT AND TRADEMARK OFFICE
CERTIFICATE OF CORRECTION

PATENT NO. : 7,395,169 B2
APPLICATION NO. : 11/446625
DATED : July 1, 2008
INVENTOR(S) : Hans Martin Vonstaudt Page 1 of 1

It is certified that error appears in the above-identified patent and that said Letters Patent is hereby corrected as shown below:

Title Page:
In the Inventor, (75), delete Inventor Address, "Kirchheim/Teck-Nabern (DE)" and replace with -- Weilheim (DE) --.

Signed and Sealed this

Thirtieth Day of September, 2008

JON W. DUDAS
*Director of the United States Patent and Trademark Office*